United States Patent [19]
Giles

[11] Patent Number: 5,975,927
[45] Date of Patent: Nov. 2, 1999

[54] COMMUNICATIONS CARD HAVING ROTATING COMMUNICATIONS PORT

[75] Inventor: Rick D. Giles, Sandy, Utah

[73] Assignee: 3Com Corporation, Santa Clara, Calif.

[21] Appl. No.: 09/100,524

[22] Filed: Jun. 18, 1998

Related U.S. Application Data

[63] Continuation-in-part of application No. 08/976,819, Nov. 24, 1997, which is a continuation-in-part of application No. 08/689,715, Aug. 16, 1996, Pat. No. 5,727,972, which is a continuation of application No. 08/291,277, Aug. 16, 1994, Pat. No. 5,547,401, which is a continuation-in-part of application No. 08/040,656, Mar. 31, 1993, Pat. No. 5,338,210, which is a continuation-in-part of application No. 07/974,252, Nov. 10, 1992, Pat. No. 5,330,062, which is a division of application No. 07/866,670, Apr. 8, 1992, Pat. No. 5,183,404.

[51] Int. Cl.$^6$ .................................................. H01R 13/44
[52] U.S. Cl. ............................................................ 439/131
[58] Field of Search ................................... 439/131, 946, 439/946.2

[56] References Cited

U.S. PATENT DOCUMENTS

| | | | |
|---|---|---|---|
| 5,494,449 | 2/1996 | Chioo | 439/76.1 |
| 5,727,972 | 3/1998 | Aldous et al. | 439/946.2 |

OTHER PUBLICATIONS

IBM,Pivotable RJ–11 Style Connector, IBM Technical disclosure Bulletin vol 38 #4 p.355.

*Primary Examiner*—Neil Abrams
*Assistant Examiner*—J. F. Duverne
*Attorney, Agent, or Firm*—Workman, Nydegger & Seeley

[57] ABSTRACT

A communications card is provided having a plurality of communications ports, capable of receiving and being placed in electrical communication with a media connector, that are pivotably maneuverable from within a housing of the communications card, a closed position, to a position outside of the card, an open position, to reveal the communications ports. In a preferred embodiment, the communications card has an upper and lower planar surface from which an elongate member pivots about a pivot means between the open and closed positions. A rail insertably mated with a channel of the elongate member is provided to guide the elongate member between the open and closed positions. A spring and a cam pin act in apposition against the elongate member to maintain the elongate member in each of the open and closed positions. A tab formed in the upper and planar surfaces is provided to reveal a portion of the elongate member so that a user can depress the elongate member to cause the elongate member to maneuver from the closed to the open position and vice versa. The communications card also has a printed circuit board capable of being placed in electrical communication with a host computer. The printed circuit board is also in electrical communication with the apertures by an electrical connection means to ultimately connect the media connector, attached to a communications line, with the computer.

24 Claims, 6 Drawing Sheets

COMMUNICATIONS CARD HAVING ROTATING COMMUNICATIONS PORT

RELATED APPLICATIONS

This application is a continuation in part of U.S. Application Ser. No. 08/976,819, filed Nov. 24, 1997, which is a continuation-in-part of Application Ser. No. 08/689,715 filed Aug. 16, 1996, now issued as U.S. Pat. No. 5,727,972, which is a continuation of U.S. Application Ser. No. 08/291,277, filed Aug. 16, 1994, now issued as U.S. Pat. No. 5,547,401, which is a continuation-in-part of U.S. Application Ser. No. 08/040,656, filed Mar. 31, 1993, now issued as U.S. Pat. No. 5,338,210, which is a continuation-in-part of U.S. Application Ser. No. 07/974,252, filed Nov. 10, 1992, now issued as U.S. Pat. No. 5,330,062 which is a divisional of U.S. Application Ser. No. 07/866,670, filed Apr. 8, 1992, now issued as U.S. Pat. No. 5,183,404.

BACKGROUND OF THE INVENTION

1. The Field of the Invention

The present invention relates generally to communications cards. More specifically, the present invention relates to the interface between physical/electrical media connectors and a communications card useful in a computer system. Even more specifically, the present invention relates to an improved interface having a communications port rotatable for acceptance of the media connectors.

2. The Relevant Technology

Communications cards such as modems, local area network (LAN), wide area network (WAN) or Ethernet cards, etc. useful in personal computers have generally conformed to the standards developed by the Personal Computer Memory Card International Association (PCMCIA). This organization comprised of hundreds of manufacturers of memory cards and related peripheral equipment has, by convention, determined that the spatial standard for all memory cards used in down-sized personal computers should be restricted to a rectangular space approximately 55 mm in width, 85 mm in length and about 3.3 mm, 5 mm and 10.5 mm in depth for Type I, II and III cards, respectively.

The size constraints imposed by this PCMCIA standard, however, has caused a well known incompatibility problem between media connectors and the communications card. This problem occurs because the depth of a PCMCIA Type II standard communications card, for example, is limited to about 5 mm whereas the depth of a typical media connector, such as an RJ-11 type or 8-pin miniature modular plug, is approximately 8–12 mm.

Numerous prior art devices have attempted to provide a solution to this depth incompatibility, but problems have persisted. For example, some prior art devices use flexible cord adapters matable at different ends to both the communications card and the media connector. Because of the numerous varieties of specific brands of communications cards, these adapters are often incompatible with more than one brand of card which causes inflexibility. Also, because the adapter is an extra piece of computing equipment, it is frequently forgotten or misplaced.

Other prior art devices use various snap-on adapters matable between the communications cards and the media connector. Because of their precarious positioning outside of the computer housing, these adapters are prone to breakage. If left in place during transport, they also disrupt the computer contour which causes incompatibility problems with many streamlined down-sized computer cases. Some snap-on adapters are so large that they even tend to prohibit the insertion of additional communications cards in adjoining or adjacent computer card slots. As with the flexible cord adapters, these are also potentially lost or forgotten.

Still other prior art devices use rotating members that expose a media connector jack in an extended position while concealing the jack in a retracted position. U.S. Pat. No. 5,411,405 teaches such a device. In this patent, to maneuver the jack between the extended and retracted positions, a user pulls or manipulates a minute finger grip. This, however, presupposes that a user has adequate manual dexterity to manipulate such a small device. As a result, difficulty is created for impaired users incapable of such manipulation.

This device is also problematic because, when the jack is exposed, no means exist to prevent the jack from rotating back from the extended to the retracted position. Such rotation, if allowed to occur with a media connector mated to the jack, subjects the media connector to breakage.

In general, this patent teaches that the rotating member is semi-circular in shape. Presumably, this allows for rotation that is substantially unhindered by the corners of a PCMCIA styled card. Disadvantageously, however, a semi-circular rotating member impinges upon the shape of the printed circuit board(s) internal to the communications card. This causes limitation in the design thereof. Subsequently, this also increases labor costs because special designs usually require unique tooling and specialty maintenance before and during the manufacture process.

While many prior art devices have tried to solve the depth incompatibility problem between the PCMCIA standard communications card and the media connector, a "pop-out" or sliding interface device has emerged as a popular solution. The pop-out interface device, known commonly as the XJACK® connector initially produced by MEGAHERTZ Corp., now owned by 3 Com Corp., solves many of the interface problems posed by prior art devices. Such solved problems include, but are not limited to: (i) the elimination of carrying along an extra interfacing device compatible with both the media connector and the PCMCIA communications card; (ii) the elimination of ensuring a DAA in the interfacing device is compatible with the computer; (iii) the elimination of physical interference between adjacent PCMCIA communication cards in adjacent slots when the PCMCIA communication card has an enlarged portion thereof larger than the conventional 5 mm thickness; (iv) the elimination of potential breakage of the interface connector when not in use; and (v) the elimination of protrusions beyond the normal dimensions of the computer so that the computer profile is more compatible with devices typically transporting laptop computers.

This pop-out interface has also had numerous variants thereof. In one particular variant, the communications card has been adapted for use with both a pop-out interface and a custom 15-pin connector in a juxtaposed manner to allow for simultaneous connections with a plurality of media connectors. Although useful, inherent with such a design is the difficulty a consumer confronts when trying to replace custom parts.

Accordingly, it is desirous to overcome the foregoing shortcomings in the prior art and still provide a communications card meeting the PCMCIA standards compatible with one or more typical media connectors.

OBJECTS AND SUMMARY OF THE INVENTION

It is, therefore, an object of the present invention to provide a communications card, meeting the PCMCIA standards, compatible with one or more typical media connectors.

It is another object of the present invention to provide a communications card having an integrated interface means of achieving media connector compatibility to prevent loss of equipment and ensure compatibility between the communications card and the interface.

It is still another object of the present invention to provide a communications card having means of achieving media connector compatibility while preventing disruption of the computer profile.

It is yet another object of the present invention to provide a communications card having means of achieving media connector compatibility while allowing insertion of additional communications cards in adjacent computer card slots.

It is still yet another object of the present invention to provide a communications card having means of achieving media connector compatibility while allowing increased space for a printed circuit board to improve flexibility in design and decrease labor costs before and during manufacturing.

It is a further object of the present invention to provide a communications card having rotating means of achieving media connector compatibility.

It is an even further object of the present invention to provide a communications card having rotating means of achieving media connector compatibility while providing means for maintaining positions selected by a user to prevent damage to the media connector.

It is still a further object of the present invention to provide a communications card having rotating means of achieving media connector compatibility requiring minimal dexterity during operation.

It is a concomitant object of the present invention to provide a communications card having means of achieving media connector compatibility while facilitating simple replacement of parts.

In accordance with the invention as embodied and broadly described herein, the foregoing and other objectives are achieved by providing a communications card having a plurality of communications ports that are pivotably maneuverable from within a housing of the communications card to a position outside of the card to reveal the communications ports. Each communications port is capable of receiving and being placed in electrical communication with a media connector, such as an RJ-11, which is attached to a communications line like a phone line.

In a preferred embodiment, the communications card has an upper and lower planar surface from which an elongate member pivots between an open and a closed position. Formed within the elongate member are a plurality of communications ports which are revealed in the open position and concealed in the closed position. A rail insertably mated with a channel of the elongate member is provided to guide the elongate member between the open and closed positions. A spring and a cam pin act in apposition against the elongate member to maintain the elongate member in each of the open and closed positions. A tab formed in the upper and lower planar surfaces is provided to reveal a portion of the elongate member so that a user can simply press against the elongate member to cause the elongate member to maneuver from the closed to the open position and vice versa.

The communications card also has a printed circuit board capable of being placed in electrical communication with both a host computer and the apertures. Ultimately, this allows the communications line attached to the media connector to be electrically connected with the computer.

A system for connecting the host computer to the communications line via the communications card is also provided.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

The present invention relates primarily to the interface between physical/electrical media connectors and a communications card useful in a computer system. Ultimately, this interface enables a communications line, such as a phone line, to be connected with a computer to achieve conveniences such as the transfer of data from between a variety of computing locations. Preferably, the communications card is a modem, LAN, WAN, Ethernet or other communications card having the physical attributes as those described in reference to the PCMCIA standards, such as a Type I, II or III cards, and is matable with a host computer in a PCMCIA styled communications slot thereof.

As used herein, the term physical/electrical media connector, or media connector, preferably connotes a media connector for use in electrically connecting with a communications line and possess physical attributes as described in F.C.C. Part 68, subpart F. Specific connectors such as RJ-xx types like the RJ-11, RJ-12, RJ-45, etc. are all references to specific exemplary media connectors falling within the broader parameters of the term physical/electrical media connectors and should not be used to limit the scope of the invention herein. In a preferred embodiment, however, an RJ-xx style connector is connected with a phone line for connecting to a computer.

Figure 1:
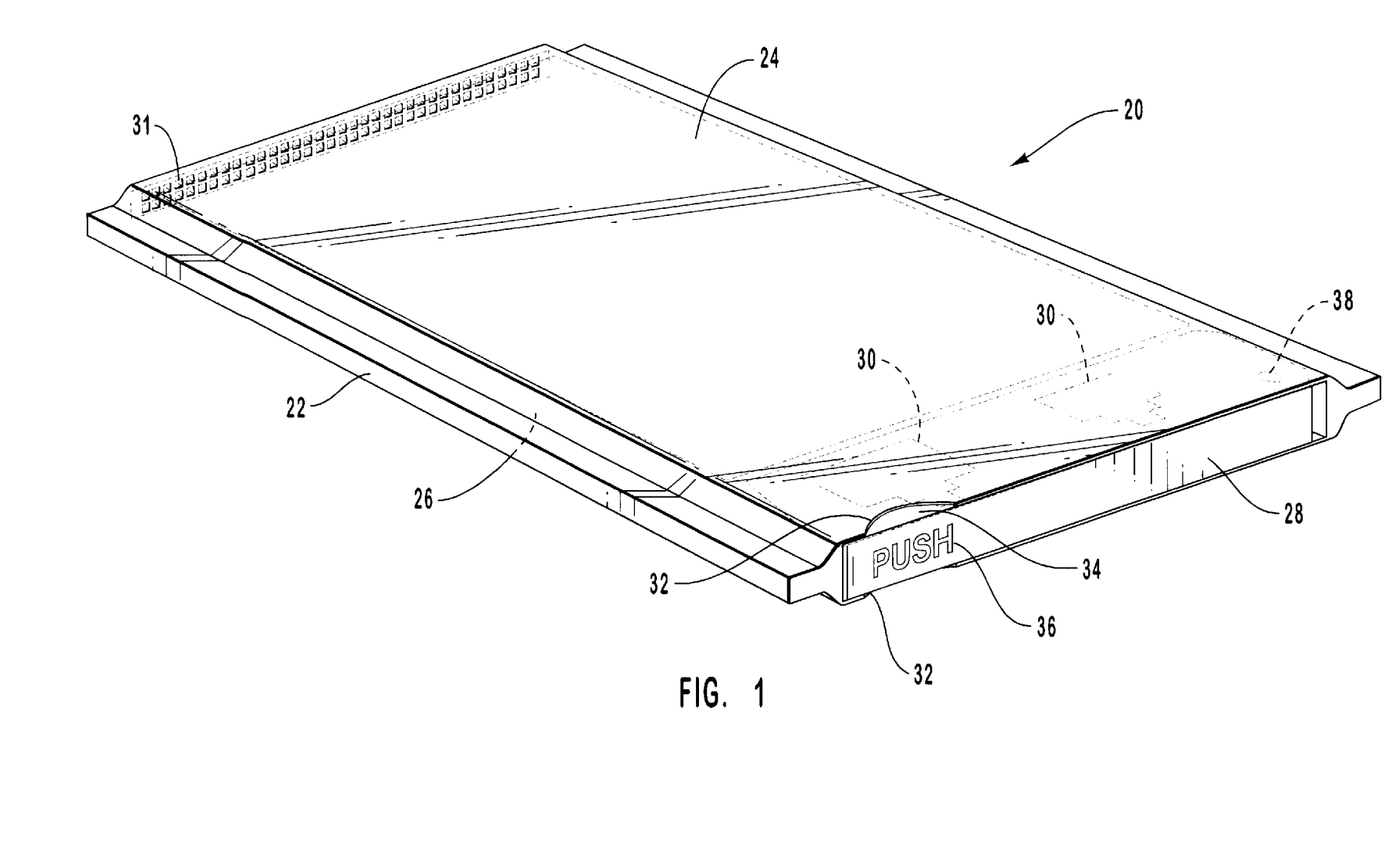
FIG. 1 is a perspective view of a communications card having rotating communications ports in accordance with the present invention.

In FIG. 1 a communications card in accordance with the present invention is depicted generally as 20. The communications card 20 has a housing 22 with an upper 24 and lower planar surface 26.

Extendable from between the upper and lower planar surfaces is an elongate member 28. Formed within the elongate member 28 is at least one communications port 30. For brevity, the communications port may interchangeably be referred to as aperture 30. In this embodiment, two apertures 30 are shown as RJ-xx style jacks for mating reception of an RJ-xx connector well known in the art and not described herein in detail.

As subsequently described in detail, the apertures each have means for being placed in electrical communication with the media connector matingly placed therein. Electrical connection means are also provided to allow electrical communication between the apertures 30 and a printed circuit board (not shown) housed internally within the communications card 20. As is known, the printed circuit board (PCB) is a device onto which a circuit has been printed for the purposes of performing particular functions of the communications card such as the conversion and modulation of data as in a modem. It is also within the scope of this invention that the finctions performed by the PCB can equivalently be performed by discrete components or by combinations of discrete components and a modified PCB. These variants are all generically referred to herein as a PCB.

As is also known, the PCB has means for being placed in electrically communication with a host computer. Under the PCMCIA standards, this means is usually a female 68 pin connector 31 attached to the housing 22 of the communications card, at the end of the communications card opposite the end of the elongate member, for mating reception with a male 68 pin connector in the PCMCIA communications card slot of a computer. These connections and interfaces are well known and are not described herein in detail.

Formed within either the upper 24 or lower planar surface 26, or both, is a tab 32 revealing a portion 34 of the elongate member 28. During use, tab 32 enables a user's finger to depress against a lengthwise edge 36 of the elongate member 28 (labelled PUSH) to pivot the end of the elongate member 28, opposite the end of the elongate member 28 rotatingly engaged about pivot means 38, inward between the upper and lower planar surfaces. In this manner, the elongate member 28 is enabled to pivotingly rotate from between a plurality of positions. As shown in FIG. 1, the elongate member 28 is in a closed position.

Figure 2A:
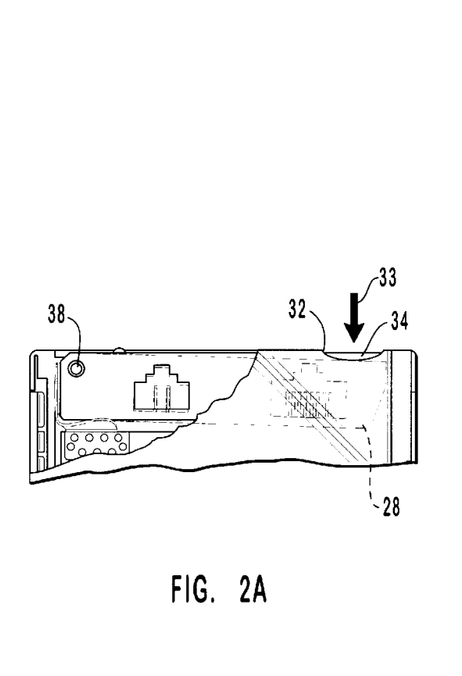
FIGS. 2A–2C are plan views of the communications ports being rotated from a closed position to an open position.
Figure 2B:
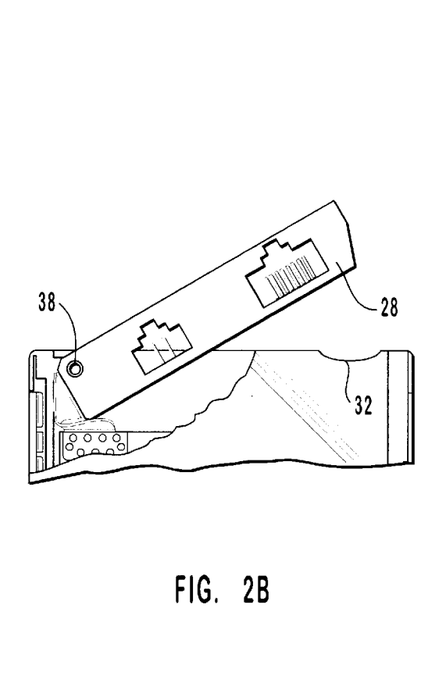
Figure 2C:
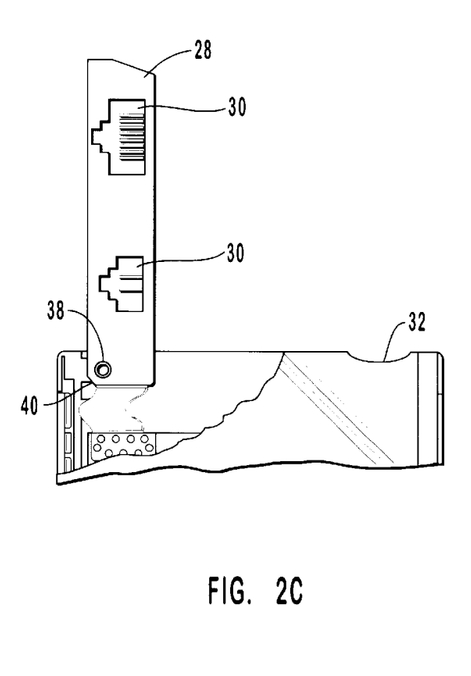

With reference to FIGS. 2A–2C, the elongate member 28 is shown during various stages of maneuvering from the closed position of FIG. 1 to an open position of FIG. 2C. In FIG. 2A, the elongate member 28 is maneuvered from the closed position (indicated by solid lines) to a depressed position (indicated by dashed lines) by pressing against the elongate member 28 near tab 32 as indicated by arrow 33. In so doing, the elongate member rotates clockwise about pivot means 38 until the lengthwise edge of the elongate member is approximately flush with the most recessed portion of the tab 32 in the upper or lower planar surface.

As subsequently described in relation to the biasing and guiding means, in FIG. 2B, the elongate member 28 is biased from the depressed position to an intermediate position between the open and closed positions. In this intermediate position, the elongate member is pivoted counter-clockwise about pivot means 38. The elongate member 38 continues travelling counter-clockwise until the elongate member 38 reaches the open position of FIG. 2C.

In this manner, when the communications card 20 is fully seated within the communications card slot of a computer, the apertures 30 will be exposed beyond the contour of the computer to readily receive at least one media connector. In an opposite manner, the elongate member is maneuvered from the open position back to the closed position.

In this embodiment, the pivot means 38 allowing maneuvering of the elongate member from between the open and closed positions is a shaft rotatingly engaged with the elongate member and fixedly attached at either end to the upper and lower planar surfaces.

The pivot means, however, could encompass any variety of other devices providing for pivoting of the elongate member and still be within the scope of the invention. For example, the shaft may be replaced with a ball-joint arrangement, mating contoured surfaces, various grooved arrangements, combinations thereof or any other similarly related device.

The pivot means may also be located on the opposite side of the communications card to permit the elongate member to pivot open and closed in an oppositely rotating fashion. As desired, the pivot means may also be adjusted from a substantially comer position of the elongate member to a centerline position. Regardless of where the pivot means 38 is located, it will be appreciated that the elongate member 28 may be chamfered to provide better rotating clearance with the housing of the communications card as along corner 40.

It is an advantage of the present invention that numerous problems of the prior art are solved. For example: (i) the transporting of an extra interfacing device compatible with both the media connector and the communications card is eliminated; (ii) physical interference between adjacent communication cards slots is prevented so that each slot can house a communications card while each communications card is in receipt of a media connector; (iii) because the elongate member can be returned to a closed position when not in use, the potential breakage of the interface connector is substantially eliminated; and (iv) awkward protrusions beyond the normal dimensions of the computer are eliminated so that the computer profile is more compatible with devices typically transporting laptop computers.

Figure 3:
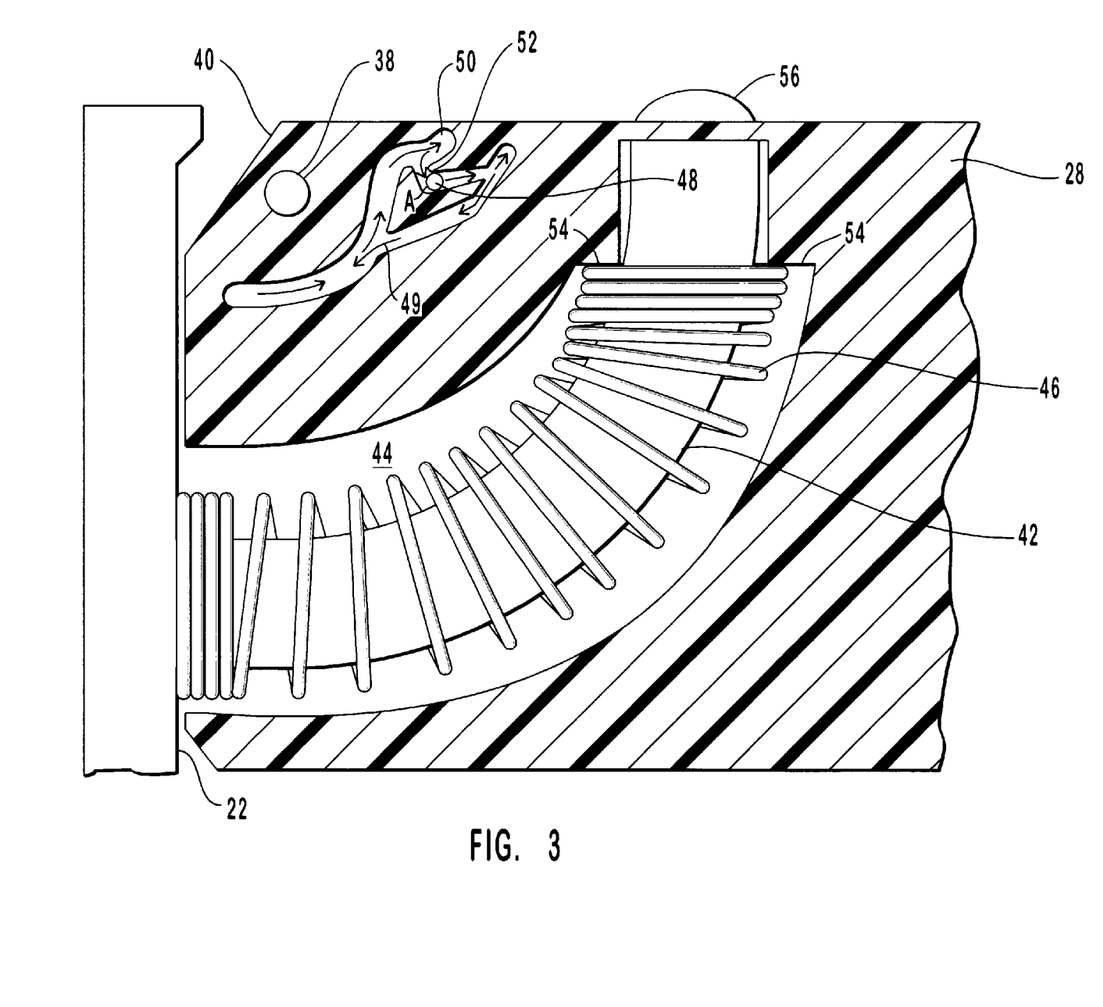
FIG. 3 is a plan view of a pivoting means, a guiding means and a biasing means facilitating the rotation of the communications ports.

Cooperating in the maneuvering of the elongate member 28 between the plurality of positions is a guiding means and a biasing means. With reference to FIG. 3, the guiding and biasing means are shown on a portion of elongate member 28 near pivot means 38.

A preferred guiding means includes a rail 42, attached to housing 22 of the communications card 20, insertably mated with a channel 44 formed within the elongate member. A preferred biasing means includes a spring 46, in a wide portion of the channel 44, and a cam pin 48 acting in a trench 50 in apposition against the elongate member. The guiding and biasing means in FIG. 3 are depicted in correspondence to the closed position of the elongate member.

In particular, the closed position places the cam pin 48 in abutment against wall 52 in trench 50 at position A. Whereas, the spring 46, in the closed position, is compressed about a portion of the rail 42 in the wide portion of the channel 44 between a ledge 54, where the channel transitions from a wide portion to a narrow portion, and the housing 22.

Preferably, the cam pin 48 is fixedly attached to one or both of the planar surfaces of the housing 22 of the communications card and is sequenced through the trench 50 in one direction as the elongate member is maneuvered through its positions. This sequencing is known and is preferably accomplished by various locks within the trench that only permit uni-directional travel therein as indicated by arrows 49 within trench 50. As a result, since the cam pin is fixed, as the spring biases the elongate member in a counter-clockwise rotation against ledge 54, the maneuvering of the elongate member 28 is prevented, and the elongate member remains in the closed position, until the cam pin 48 is moved from position A.

The operation of the guiding and biasing means will be described with reference to FIGS. 4A–4C and 5A–5C in correspondence to the maneuvering of the elongate member 28 from the depressed position (2A) through the intermediate position (2B) to the open position (2C).

Figure 4A:
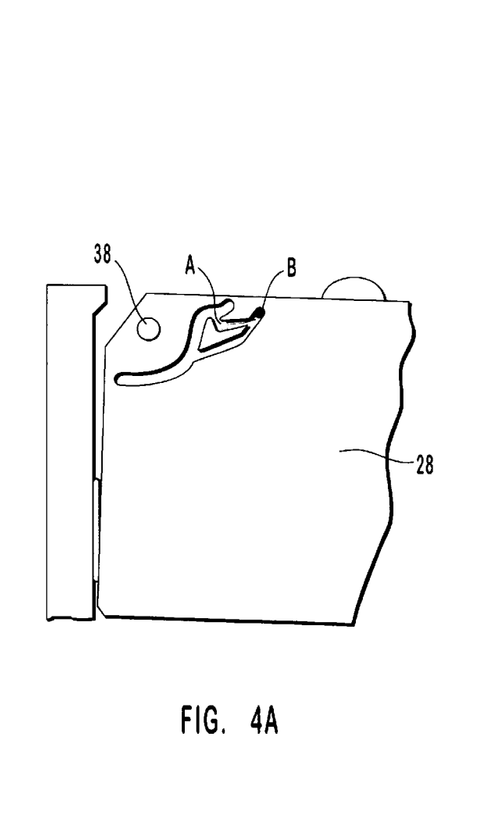
FIGS. 4A–4C and 5A–5C are plan views of the guiding and biasing means of FIG. 3 as the communications ports are rotated from the closed position to the open position in correspondence with FIGS. 2A–2C.

In FIG. 4A, the cam pin 48 moves from position A to position B when the elongate member is depressed near the tab 32 because the depressing of the elongate member reorients the trench with respect to the cam pin to allow the cam pin to move to position B. Simultaneously, in Figure 5A, the spring 46 is further compressed between the ledge 54 and the housing 22 because of the force exerted by the user (arrow 33) along the elongate member 28 near the tab 32.

Figure 4B:
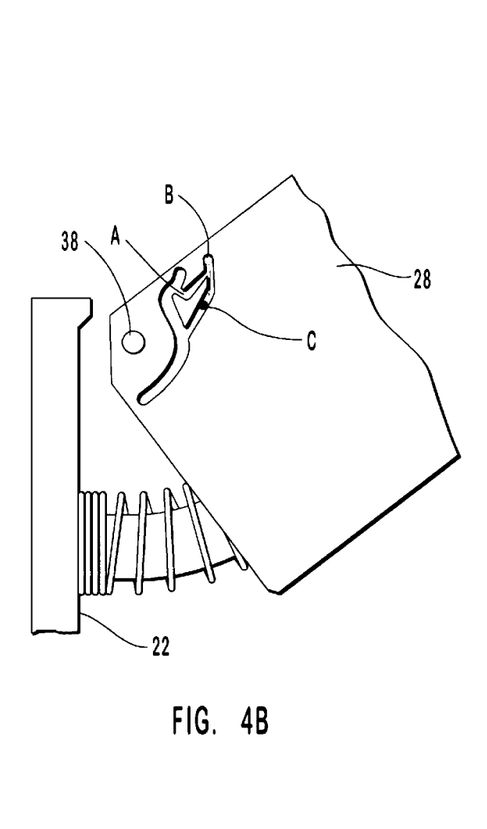
Figure 5A:
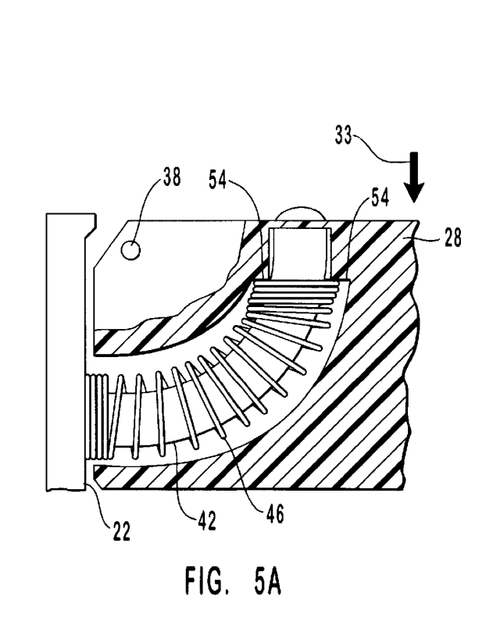
Figure 5B:
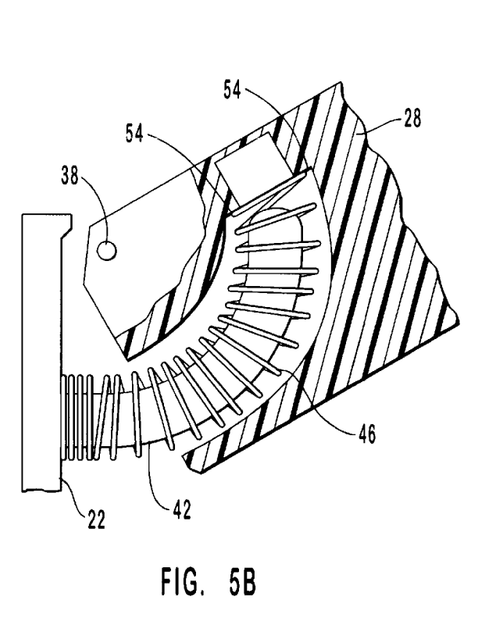
Figure 5C:
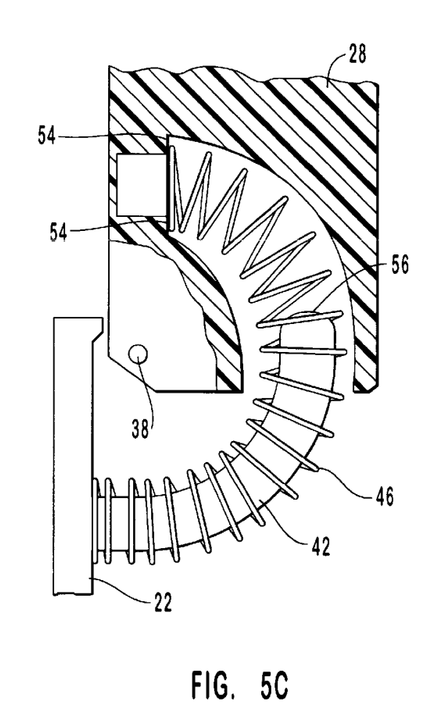

In FIGS. 4B and 5B, once the depressing force along the elongate member near tab 32 is released, the spring 46 is unrestricted by the cam pin 48 and is free to bias the elongate member outward from between the upper and lower planar surfaces until the elongate member reaches the open position as indicated in FIG. 5C.

In the open position, the spring 46 is still compressed between the housing 22 and the ledge 54, but in this position, the rail insertably mated within the channel 44 of the elongate member 28 has been removed from the narrow to the wide portion of the channel and the spring 46 extends beyond a terminal end 56 of the rail.

Figure 4C:
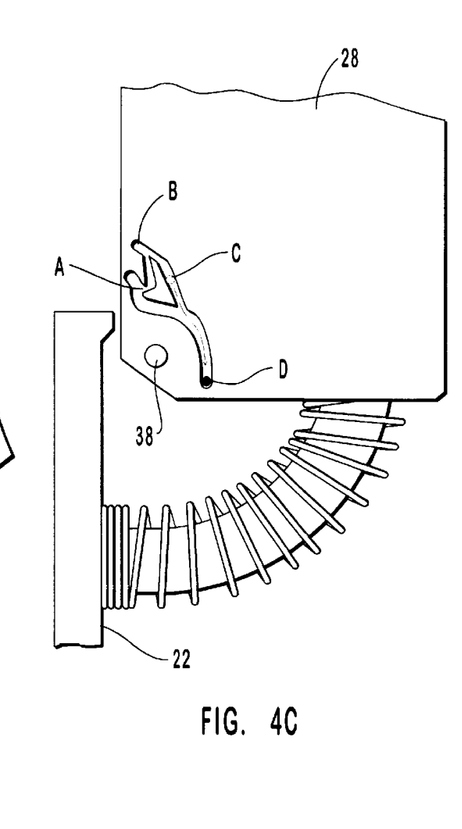

As the spring 46 biases the elongate member outward, the cam pin 48 guides through trench 50 at position C (FIG. 4B) until the elongate member reaches the open position which corresponds to the cam pin 48 at position D (FIG. 4C).

In the open position, the cam pin 48 in trench 50 again acts along the wall thereof in apposition to the bias of the spring 46 to maintain the elongate member 28 in the open position until such time as the trench 50 is reoriented and the cam pin 48 is free to maneuver from position D.

This reorientation occurs when a user exerts a clockwise force against the elongate member and moves the elongate member from the open to the closed position. At this time, the cam pin follows clockwise in the trench 50 back to position A from where it began.

Simultaneously, as the elongate member is maneuvered from the open to the closed position, the rail 42 is inserted back into the narrow portion of the channel 44 past the ledge 54 in a manner opposite to the opening of the elongate member until the position illustrated in FIG. 3 is achieved.

It will be appreciated that the guiding and biasing means can be implemented using various other equivalent structures and be within the intended scope of the invention. For example, the rail 42 as depicted in the closed position extends beyond the elongate member 28 at the terminal end 56 thereof to provide added support and steady operation. The rail, however, may be arranged to not extend beyond the elongate member. Alternatively, the rail may be replaced with a pin, cam, rod, shaft, etc. affixed to one of the planar surfaces for guiding the elongate member via a channel, duct, conduit, etc. It is even contemplated that the guiding means can be removed altogether.

The biasing means may alternatively include a sprung wire for imparting rotational biasing to the elongate member. Retention clips notched, slid, hooked, etc. into the elongate member are also viable alternatives to the cam pin to oppose the outward biasing of the spring. Electromechanical switches, gears, solenoids, etc. powered by the host computer during use are also contemplated as imparting the rotational biasing to the elongate member.

Figure 6:
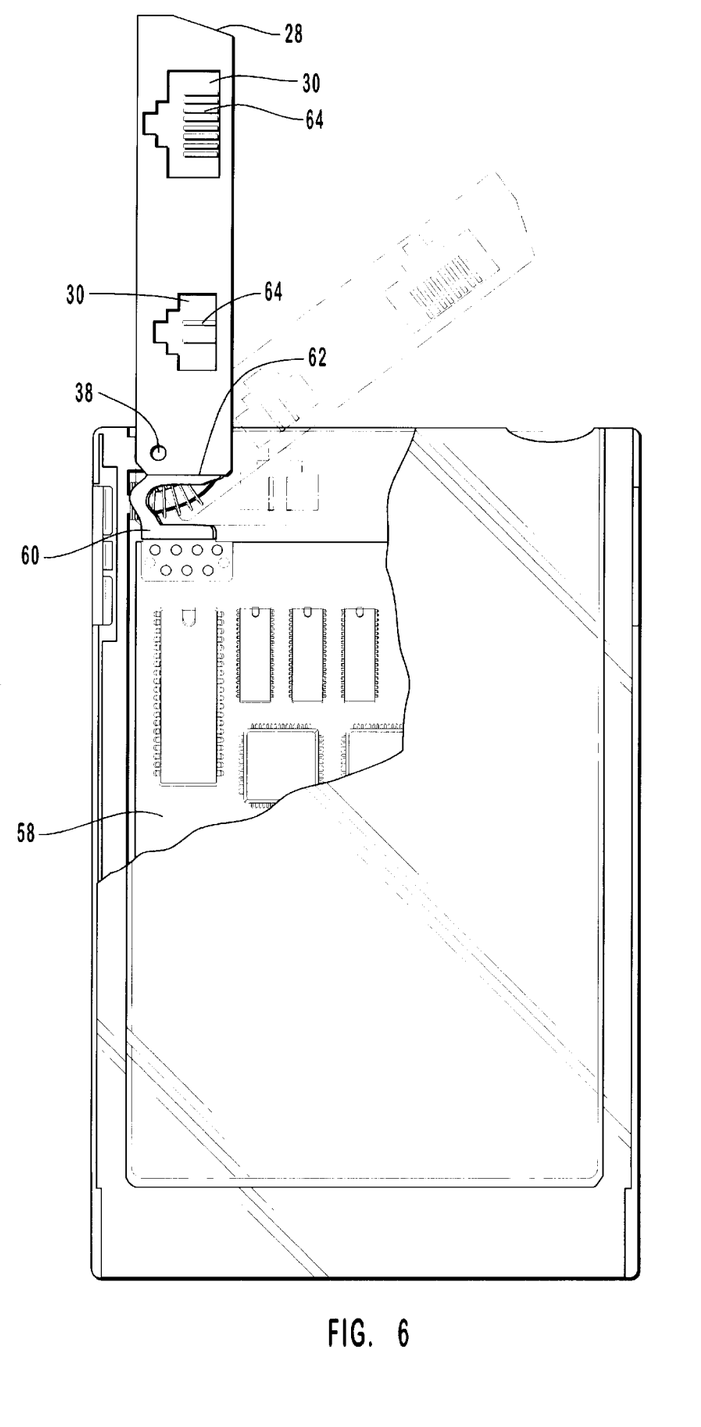
FIG. 6 is a plan view of a cabling means for electrically connecting the communications ports with a printed circuit board of the communications card.

In FIG. 6, an electrical connection means for electrically coupling the apertures (communications ports) to the printed circuit board (PCB) 58 is depicted as electrical wireribbon cabling 60. The cabling 60 attaches to the PCB 58 at any variety of places and is attached to the elongate member 28 at a central location 62 thereof where a plurality of contact wires 64 are internally routed from the apertures 30.

In this manner, the cabling 60 is provided with a predetermined and adequate amount of cabling to stretch from the elongate member to the PCB when the elongate member reaches its fully extended position, the open position.

However, the electrical connection means may alternatively be any arrangement for providing electrical coupling from the contact wires to the PCB and, ultimately, the communications line to the host computer. As such, other electrical connection means include, but are not limited to, individual wires, wire bundles, sliding electrical contact arrangements, discrete conductors, etc.

Means for attaching the electrical connection means to each of the elongate member and the PCB are well known and include connectors such as zero-insertion-force (ZIF) connectors, soldering, various epoxy compositions, etc.

Means for retaining a media connector within the communications ports (apertures) are also well known and include a variety of releasable retention clips, wires, etc. and are also not described herein in detail.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A communications card for use in interfacing a media connector with a host computer, comprising:

an elongate member pivotable about a point from between a plurality of positions;

an aperture formed within said elongate member capable of receiving said media connector;

guiding means for facilitating the maneuvering of said elongate member as said elongate member pivots from between said positions; and biasing means for maintaining said elongate member in each said position.

2. The communications card according to claim 1, wherein said biasing means comprises a spring and a cam pin acting in apposition against said elongate member.

3. The communications card according to claim 1, wherein said guiding means comprises a rail insertably mated with a channel of said elongate member.

4. The communications card according to claim 1, wherein said positions include an open and closed position.

5. The communications card according to claim 1, wherein said aperture is an RJ-xx styled jack.

6. The communications card according to claim 1, wherein said pivoting means comprises a shaft rotatably engaged with said elongate member.

7. The communications card according to claim 1, further comprising a plurality of apertures formed within said elongate member.

8. The communications card according to claim 1, further comprising an access means to said elongate member to facilitate pivoting of said elongate member from between said positions.

9. The communications card according to claim 8, further comprising an upper and lower planar surface wherein said access means is a tab formed in one of said surfaces.

10. The communications card according to claim 1, further comprising a printed circuit board capable of being placed in electrical communication with said host computer.

11. The communications card according to claim 10, wherein said aperture comprises a means for being placed in electrical communication with said media connector further comprising an electrical connection means between said printed circuit board and said means of said aperture.

12. The communications card according to claim 11, wherein said electrical connection means comprises an electrical ribbon cable.

13. A communications card for use in interfacing a media connector with a host computer, comprising:
   an upper and lower planar surface;
   a pivoting means;
   an elongate member substantially between said upper and lower planar surfaces pivotable about said pivoting means from between an open and a closed position;
   an aperture formed within said elongate member capable of receiving said media connector and being placed in electrical communication therewith;
   a guiding means facilitating movement of said elongate member as said elongate member pivots from between said open and said closed position;
   a biasing means for maintaining said elongate member in each of said open and closed positions;
   a printed circuit board capable of being placed in electrical communication with said host computer; and
   an electrical connection means for electrically coupling said aperture to said printed circuit board.

14. The communications card according to claim 13, wherein said biasing means comprises a spring and a cam pin acting in apposition against said elongate member.

15. The communications card according to claim 14, further comprising a tab formed within one of said surfaces revealing access to a portion of said elongate member when said elongate member is in said closed position.

16. The communications card according to claim 15, wherein said guiding means comprises a rail insertably mated with a channel of said elongate member, said spring positioned about a portion of said rail in a wider portion of said channel during use.

17. The communications card according to claim 16, wherein said pivoting means comprises a shaft rotatably engaged with said elongate member.

18. A communications card having a plurality of communications ports, each said communications port capable of receiving and being placed in electrical communication with a media connector, comprising:
   an upper and lower planar surface, at least one of said surfaces having a tab formed therein;
   an elongate member substantially between said upper and lower planar surfaces housing said communications ports pivotable about a pivoting means from between an open to a closed position, said tab revealing access to said elongate member to facilitate pivoting of said elongate member from between said open and closed positions by depressing said elongate member near said tab during use;
   a rail insertably mated with a channel of said elongate member to guide said elongate member as said elongate member pivots from between said open and said closed position;
   a spring and a cam pin acting in apposition against said elongate member to bias said elongate member in each of said open and closed positions;
   a printed circuit board capable of electrically communicating with a host computer; and
   an electrical connection means for electrically coupling said communications ports to said printed circuit board.

19. A system for mating a communications line with a computer, comprising: a media connector attached to said communications line; and a communications card matable with a communications port of said computer, having:
   a pivoting means;
   an elongate member pivotable about said pivoting means from between an open and closed position;
   an aperture formed within said elongate member capable of receiving said media connector when said elongate member is in said open position;
   a guiding means facilitating the maneuver of said elongate member as said elongate member pivots from between said open and closed positions; and
   a biasing means for maintaining said elongate member in said open and closed positions.

20. The system according to claim 19, wherein said communications port of said computer is a PCMCIA port.

21. The system according to claim 19, wherein said media connector is a RJ-xx style connector.

22. The system according to claim 19, wherein said communications line is a phone line.

23. The system according to claim 19, wherein said biasing means comprises a spring and a cam pin acting in apposition against said elongate member.

24. The communications card according to claim 19, wherein said guiding means comprises a rail insertably mated with a channel of said elongate member.

* * * * *

UNITED STATES PATENT AND TRADEMARK OFFICE
CERTIFICATE OF CORRECTION

PATENT NO. : 5,975,927
DATED : November 2, 1999
INVENTOR(S) : Giles, et al.

It is certified that error appears in the above-identified patent and that said Letters Patent is hereby corrected as shown below:

Title Page, Col. 1, after [75] Inventor: Rick D. Giles, Sandy, Utah, add -- "Stephen C. Aldous, Salt Lake City, Utah" --

Signed and Sealed this

First Day of August, 2000

Attest:

Q. TODD DICKINSON

Attesting Officer

Director of Patents and Trademarks